(12) United States Patent
Kever

(10) Patent No.: US 6,645,841 B2
(45) Date of Patent: Nov. 11, 2003

(54) SELECTIVE SOLDER BUMP APPLICATION

(75) Inventor: Wayne Kever, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/016,039

(22) Filed: Nov. 16, 2001

(65) Prior Publication Data

US 2003/0096448 A1 May 22, 2003

(51) Int. Cl.[7] .................. H01L 21/44; H01L 21/66; H01L 21/48; H01L 21/50; G01R 31/26
(52) U.S. Cl. ................. 438/598; 438/599; 438/600; 438/601; 438/15; 438/108
(58) Field of Search .................. 438/598, 599, 438/600, 601, 15, 108

(56) References Cited

U.S. PATENT DOCUMENTS

2001/0052786 A1 * 12/2001 Eldridge et al. ............ 324/765

* cited by examiner

Primary Examiner—Carl Whitehead, Jr.
Assistant Examiner—Nema Berezny

(57) ABSTRACT

Selective application of solder bumps in an integrated circuit package. Solder bumps are selectively applied in a solder bump integrated circuit packaging process so that portions of a circuit can be effectively disabled. The bumps may be selectively applied either to a die or to the substrate using multiple solder masks, one for each pattern of solder bumps desired or can be otherwise applied in multiple patterns depending upon which portions of the circuitry are to be active and which are to be disabled.

22 Claims, 4 Drawing Sheets

SELECTIVE SOLDER BUMP APPLICATION

FIELD OF THE INVENTION

This invention relates generally to the field of packaging semiconductor devices. More particularly, this invention relates to methods and apparatus for packaging integrated circuits using selective application of solder bumps.

BACKGROUND OF THE INVENTION

Semiconductor integrated circuits have traditionally been packaged using wirebonding technology. In this technology, as illustrated in FIG. 1, a semiconductor die 10 is attached to a chip carrier 14 (of any of a number of different configurations, e.g., dual inline package) using an adhesive. The die 10 has a plurality of conductive wirebonding pads such as pad 18 arranged around the periphery of the die 10. These wirebonding pads 18 are connected to circuitry on the die 10 to make electrical connections such as power, ground and various signal connections, depending on the die's circuitry. In order to make these connections available outside of the die, pads such as 18 are electrically connected using fine wires such as 22 that are bonded to pads 18 and to corresponding wirebonding pads 28 on the chip carrier 14. The chip carrier 14 then provides interconnections to other circuitry by use of solder pins or pads connected to the chip carrier's pads such as 28.

Such wirebonding techniques have been used successfully for many years and remain in common use today. However, the above wirebonding technique has limitations in that the wirebonding pads must usually be arranged along the periphery of the semiconductor die. This limits the number of connections that can be made. Also, power and ground connections provided to circuitry located in a central area of the die may be a significant distance from the wirebond pad 18. As semiconductor processing technology improves, the conductors used to carry such power and ground connections can be extremely fine resulting in unacceptable impedance between the point of the wirebond and the circuitry being powered.

These problems are addressed in a solder bump die connection technology illustrated in FIG. 2. This technology, although originally pioneered in the 1960s, has been more widely adopted over the last several years. In this technology, solder pads are situated at any given location of a semiconductor die 38 and corresponding pads provided on a chip carrier or other substrate 44 to which the die is to be connected. Bumps of solder such as 46 are then screened onto the die 38 at the location of the die's solder pads through a mask that permits solder to only be deposited in the desired locations. The die 38 is then set into place on the substrate 44 aligning the solder pads of die 38 with those of substrate 44, and the assembly is heated to cause the solder to flow and create both a mechanical and electrical connection.

With this improved solder bump technology, much higher density can be achieved and the electrical interconnections can be made at virtually any location on the die's surface. However, as the density of circuitry provided on the die increases, an additional problem is encountered.

When the die contains circuitry made using a relatively low resolution process (e.g., greater than 0.09 micron line technology), and the die contains logic circuitry that can be selectively activated or deactivated (e.g., to provide redundancy, selective functionality or selective configuration), it is often sufficient to simply disable clocks to the circuitry that is to be disabled. However, as line resolutions get smaller, e.g., below 0.09 microns, the power consumption of the logic circuitry due to leakage currents may be a significant contribution to overall power consumption. Due to variations in the actual circuit configuration, of course, the above line sizes should be considered only exemplary of the potential problem.

BRIEF SUMMARY OF THE INVENTION

The present invention relates generally to a semiconductor packaging. Objects, advantages and features of the invention will become apparent to those skilled in the art upon consideration of the following detailed description of the invention.

In one embodiment consistent with the present invention, selective application of solder bumps is used in mounting an integrated circuit die to a package such as a chip carrier or other substrate. Solder bumps are selectively applied in a solder bump integrated circuit packaging process so that portions of a circuit can be effectively disabled. The bumps may be selectively applied using multiple solder masks, one for each pattern of solder bumps desired or can be otherwise applied in multiple patterns depending upon which portions of the circuitry are to be active and which are to be disabled.

A method, consistent with an embodiment of the present invention, of connecting an integrated circuit die to a substrate, includes identifying a block of circuitry to be disabled within the integrated circuit die; applying a pattern of solder bumps to one of the die and the substrate, the pattern of solder bumps excluding at least one solder bump used for connection to the block of circuitry; placing the integrated circuit die on the substrate with solder pads on the die aligned with corresponding solder pads on the substrate and with the pattern of solder bumps disposed between the die and the substrate; and heating the solder bumps to cause the solder to flow and form electrical connections between the substrate and the die.

Another method, consistent with an embodiment of the present invention, of applying solder bumps for soldering a substrate to an integrated circuit die, includes identifying a block of circuitry on the integrated circuit die that is to be disabled; and applying a pattern of solder bumps to one of the die and the substrate, the pattern of solder bumps excluding at least one solder bump used for connection to the block of circuitry that is to be disabled.

Another method, consistent with an embodiment of the present invention, of configuring functionality of an integrated circuit die, includes identifying a block of circuitry to be configured by selectively making an electrical connection between a substrate and the integrated circuit die; applying a pattern of solder bumps to one of the die and the substrate, the pattern of solder bumps selectively excluding at least one solder bump used for connection to the block of circuitry; placing the integrated circuit die on the substrate with solder pads on the die aligned with solder pads on the substrate and the pattern of solder bumps disposed therebetween; and heating the solder bumps to cause the solder to flow and form electrical connections between the substrate and the die.

An integrated circuit device, consistent with certain embodiments of the present invention has an integrated circuit die having a plurality of solder pads used for conveying signals to and from the die, the integrated circuit having a plurality of blocks of circuitry. A substrate has a plurality of solder pads corresponding to at least a portion of the integrated circuit die's solder pads. A plurality of solder bumps connect the substrate to the integrated circuit die, and at least one of the blocks of circuitry is configured by virtue of omission of a solder bump for at least one connection between the substrate and the at least one of the plurality of blocks of circuitry.

Many variations, equivalents and permutations of these illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
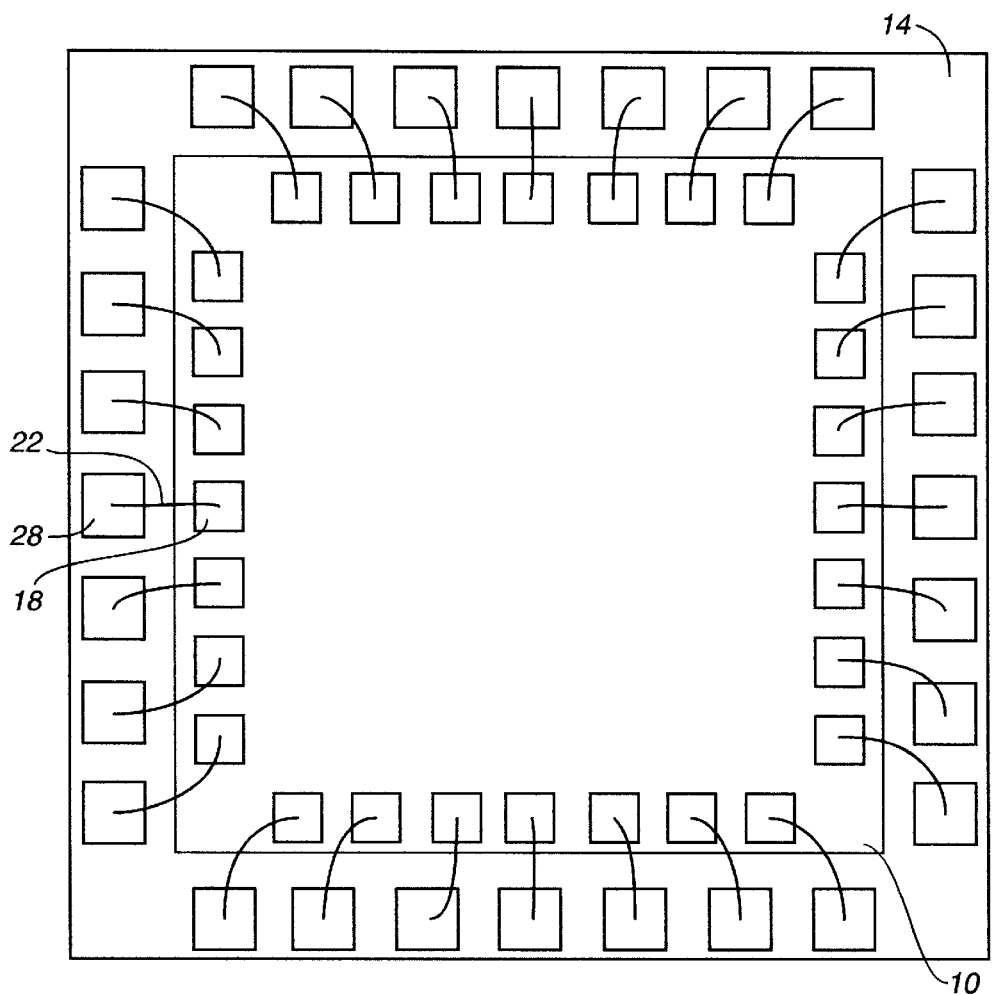
FIG. 1 illustrates a conventional wirebond integrated circuit package.
Figure 2:
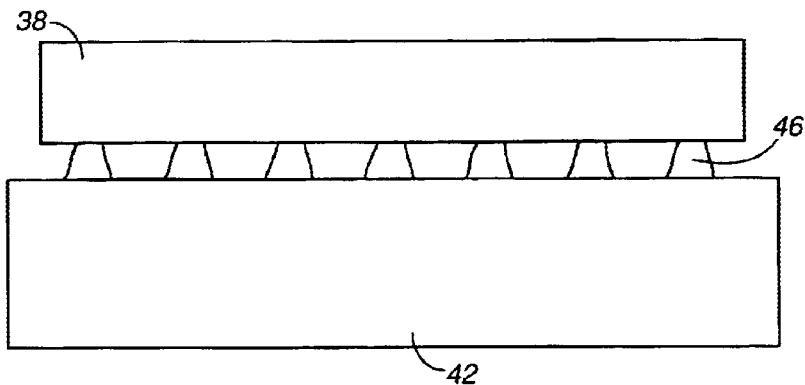
FIG. 2 illustrates a solder bump integrated circuit packaging technique.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 3:
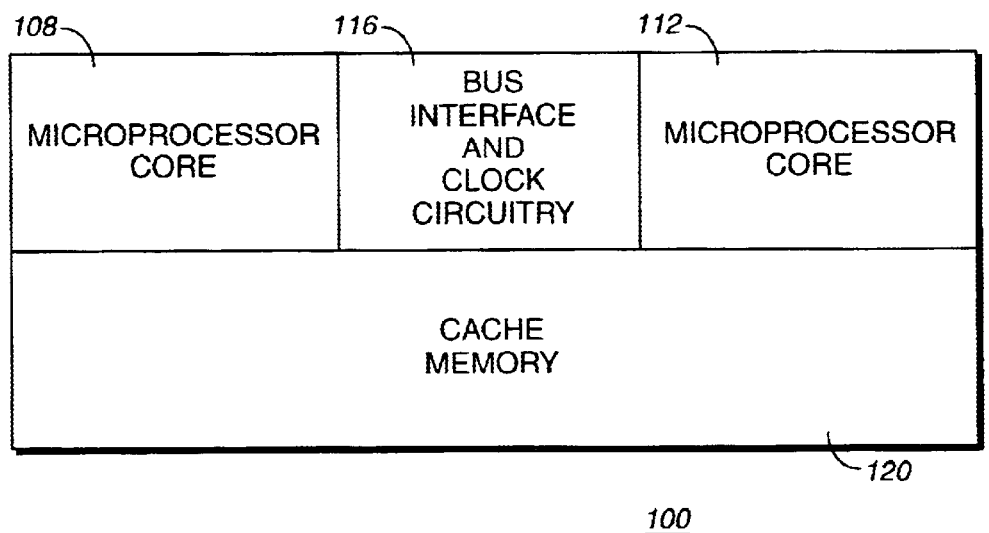
FIG. 3 illustrates an exemplary circuit configuration on an integrated circuit die consistent with an illustrative embodiment of the present invention.

Turning now to FIG. 3, an illustrative example of an integrated circuit die 100 is illustrated. In die 100, blocks of circuitry are illustrated showing the location of the circuitry on the die 100. In this example, a microprocessor circuit is implemented using a first microprocessor core (CPU) 108 and a second microprocessor core 112 along with bus interface and clock circuitry 116 and cache memory 120. In this arrangement, microprocessor cores 108 and 112 may provide redundancy in function so that the die is functional at an acceptable level if either of the microprocessor cores 108 or 112 function. If both cores 108 and 112 are functional, a higher level of performance can be achieved in this die (i.e., a greater level of processing power can be achieved by use of dual parallel processors). The functionality or failure of the two microprocessor cores can be determined during a die probe test operation.

Figure 4:
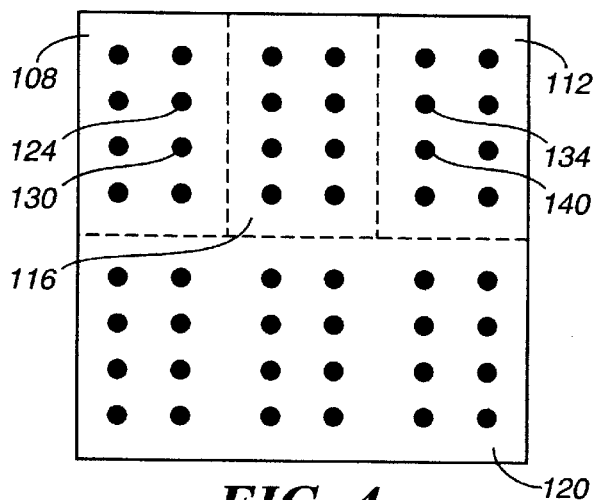
FIG. 4 illustrates a first exemplary solder bump pattern used for the exemplary integrated circuit die of FIG. 3.

FIG. 4 illustrates a solder bump pattern as it would appear on the die 100 when all circuitry is functional and is to be interconnected with the substrate. Locations of the circuitry 108, 112, 116 and 120 are depicted by broken lines and the circuit designation numbers. The illustrated solder bump patterns are applied to the die by use of a mask that allows solder to be selectively applied through the mask to the solder pad locations, or using any other technique to deposit solder only on the pad locations. In other equivalent processes, the solder could equally well be applied to the substrate rather than the die. For purposes of this illustrative example, assume that power supply voltage is applied to the circuit 108 through solder bump 124 and ground at solder bump 130. Similarly, assume that power supply voltage is applied at solder bump 134 and ground at solder bump 140 for circuit 112. Thus, using this solder bump pattern, both circuits 108 and 112 are supplied with power and are functional.

Figure 5:
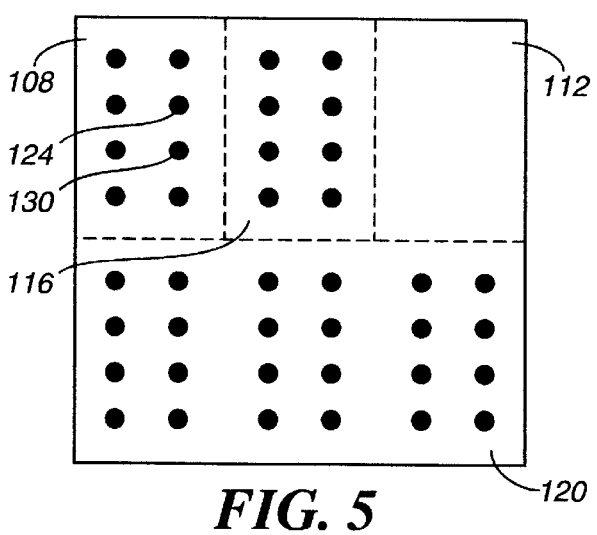
FIG. 5 illustrates a second exemplary solder bump pattern used for the exemplary integrated circuit die of FIG. 3.

In accordance with certain aspects of the present invention, a modified solder bump pattern can be used to fully isolate an unused or non-functional circuit as illustrated in FIG. 5. Locations of the circuitry 108, 112, 116 and 120 are again depicted by broken lines and the circuit designation numbers. In this illustration, circuit 112 is to be effectively disabled by virtue of not connecting the power supply voltage and ground. These connections, along with all other connections in this illustration are omitted by use of a different solder mask than that described in conjunction with FIG. 4. The solder mask used to deposit solder to die 100 in FIG. 5 has no provision for permitting any solder to be applied to interconnect any of the circuitry of circuit 112. Thus, no power or ground connections are made to circuit 112 and the circuit is isolated and disabled from the remaining circuitry of die 100. All connections are made to circuit 108 so that, in the example embodiment, a single microprocessor core 108 is active in the die soldered according to FIG. 5. The substrate used in connection with this solder bump pattern may be identical to that used in connection with FIG. 4 and incorporate a complete set of solder pads, or may omit the solder pads associated with circuit 112, without departing from the invention.

Figure 6:
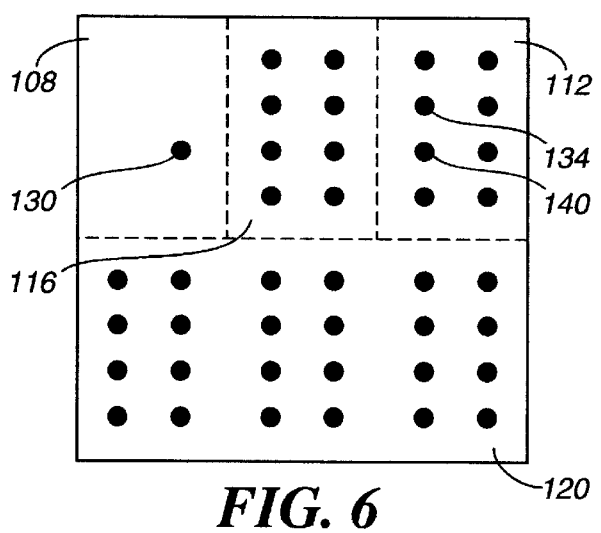
FIG. 6 illustrates a third exemplary solder bump pattern used for the exemplary integrated circuit die of FIG. 3.

FIG. 6 illustrates another exemplary solder bump arrangement in which circuit 108 is disabled and circuit 112 is enabled. Again, locations of the circuitry 108, 112, 116 and 120 are depicted by broken lines and the circuit designation numbers. In this example, circuit 108 is disabled using a third solder mask or other mechanism to selectively deposit solder on the die. Thus, in this embodiment, power and other connections are omitted to circuit 108 to effectively disable the circuit. In this illustration, however, solder pad 130 is still connected in order to make a stable ground substrate connection over the unused circuit 108. Again, the substrate used in connection with this solder bump pattern may be identical to that used in connection with FIG. 4 and incorporate a complete set of solder pads, or may omit the solder pads associated with circuit 108 (except for the ground pad 130) without departing from the invention.

By use of the present invention to fully disable unused circuitry (whether defective or optional by design), power consumption by unused circuitry can be virtually eliminated. A single die design can thus be used for multiple applications (e.g., high and lower processing power microprocessors) or defective circuitry can be disabled (e.g., defective sections of memory can be turned off). Moreover, in other embodiments, any suitable connection can be omitted by deleting solder bumps as described (e.g., by use of a specially designed mask or other techniques) so that a circuit block is disabled or a circuit is reconfigured. By way of example, a logic gate input having a pull-up resistor can be selectively connected to ground to provide a hard wired logic signal input to a logic circuit by selectively either providing or omitting a solder bump to make the connection from the gate's input to ground. Many other uses for the present technology will occur to those skilled in the art.

Figure 7:
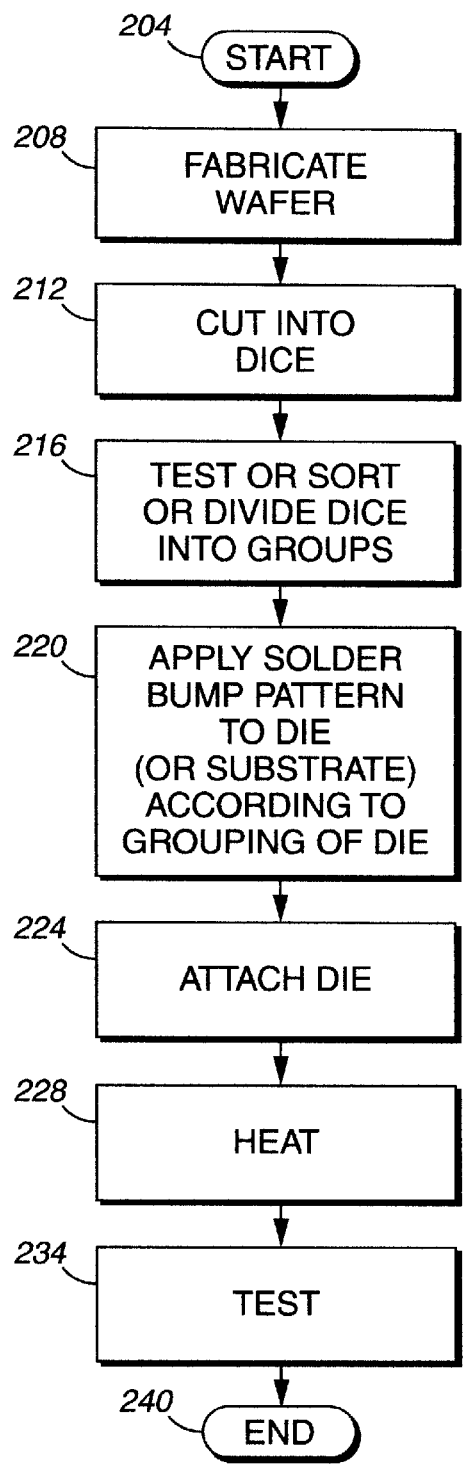
FIG. 7 is a flow chart depicting operation of a process consistent with an embodiment of the present invention.

One process by which the present invention can be implemented is illustrated in FIG. 7 as process 200 starting at 204. At 208, a wafer containing a collection of dice is processed to fabricate a plurality of integrated circuit dice. At 212, the wafer is cut into individual dice by any suitable technique such as sawing. Each individual die may then be tested or otherwise sorted or divided into groups of one or more die based upon any suitable criteria (e.g., defects, performance, inventory needs, etc.) at 216. At 220, solder is applied to the dice (or to substrates) in accordance with the grouping at 216 so that groups of certain dice are associated with certain solder bump patterns. This can be accomplished using multiple masks—one for each group, or using any other suitable mechanism for applying solder bump patterns in varying arrangements. The appropriate die is set in place on the substrate with the desired set of solder bumps at 224 and the assembly is heated at 228 to cause the solder to flow and attach the die to the substrate. Each die can then be tested at 234 if required and the process ends at 240.

Those skilled in the art will appreciate that process 200 may be carried out in slightly different order than that disclosed (e.g., reversing the order of 212 and 216) without departing from the invention. Also, although the solder is normally applied to the die, the solder could be equivalently applied to the substrate in other embodiments. Additionally, process portions may be added or deleted, depending upon production circumstances, without departing from the invention.

Thus, an apparatus and method is provided in which portions of an integrated circuit die can be disabled at the time of packaging to modify the die's functionality or to select among redundant circuits. Solder bumps are selectively applied in a solder bump integrated circuit packaging process so that portions of a circuit can be effectively disabled. The bumps may be selectively applied using multiple solder masks, one for each pattern of solder bumps desired or can be otherwise applied in multiple patterns depending upon which portions of the circuitry are to be active and which are to be disabled. In this apparatus and method, power consumption of disabled circuits is reduced or virtually eliminated to enhance power efficiency of the circuit. This technique can even be used to isolate supply to ground faults in a defective circuit block. Moreover, circuitry can be reconfigured or disabled using the present invention to provide a hard wired reconfiguration of an integrated circuit die.

Those skilled in the art will recognize that the present invention has been described in terms of exemplary embodiments based upon use of an integrated circuit having multiple microprocessor cores, however, the present invention can be used with any circuit in which there is a need or desire to disable portions of circuitry on the die, be it for control of functionality or isolation of defects.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of connecting an integrated circuit die to a substrate, comprising:

identifying a block of circuitry to be disabled within the integrated circuit die, the block of circuitry to be disabled having at least one solder pad that is used to connect to at least one solder pad of said substrate when the block of circuitry is not disabled;

applying a pattern of solder bumps to one of the die and the substrate, the pattern of solder bumps excluding at least one solder bump used for connection to the at least one solder pad of the block of circuitry to be disabled;

placing the integrated circuit die on the substrate with solder pads on the die aligned with corresponding solder pads on the substrate and with the pattern of solder bumps disposed between the die and the substrate; and heating the solder bumps to cause the solder to flow and form electrical connections between the substrate and the die.

2. The method according to claim 1, wherein the excluded solder bump, if present, would convey power supply voltage to the block of circuitry.

3. The method in accordance with claim 1, wherein the applying is carried out by applying solder through a mask selected in accordance with the block of circuitry to be disabled.

4. The method according to claim 1, wherein the identifying is carried out by testing blocks of circuitry for functionality, and wherein the block of circuitry to be disabled is determined to not be functional.

5. The method according to claim 1, wherein the identifying is carried out by determining that a specified performance criterion is required.

6. The method according to claim 1, wherein the block of circuitry to be disabled comprises one of a plurality of microprocessor cores.

7. The method according to claim 1, wherein the block of circuitry to be disabled comprises one of a plurality of memory blocks.

8. The method according to claim 1, wherein the block of circuitry to be disabled comprises one of a plurality of redundant blocks of circuitry.

9. The method according to claim 1, wherein the applying further comprises, applying a solder bump used to connect ground to the block of circuitry to be disabled.

10. A method of applying solder bumps for soldering a substrate to an integrated circuit die, comprising:

identifying a block of circuitry on the integrated circuit die that is to be disabled, the block of circuitry to be disabled having at least one solder pad that is used to connect to at least one solder pad of said substrate when the block of circuitry is not disabled; and applying a pattern of solder bumps to one of the die and the substrate, the pattern of solder bumps excluding at least one solder bump used for connection to the at least one solder pad of the block of circuitry to be disabled.

11. The method according to claim 10, wherein the excluded solder bump, if present, would convey power supply voltage to the block of circuitry.

12. The method in accordance with claim 10, wherein the applying is carried out by applying solder through a mask selected in accordance with the block of circuitry to be disabled.

13. The method according to claim 10, wherein the identifying is carried out by testing blocks of circuitry for functionality, and wherein the block of circuitry to be disabled is determined to not be functional.

14. The method according to claim 10, wherein the identifying is carried out by determining that a specified performance criterion is required.

15. The method according to claim 10, wherein the block of circuitry to be disabled comprises one of a plurality of microprocessor cores.

16. The method according to claim 10, wherein the block of circuitry to be disabled comprises one of a plurality of memory blocks.

17. The method according to claim 10, wherein the block of circuitry to be disabled comprises one of a plurality of redundant blocks of circuitry.

18. The method according to claim 10, wherein the applying further comprises, applying a solder bump used to connect ground to the block of circuitry to be disabled.

19. A method of configuring functionality of an integrated circuit die, comprising:

identifying a block of circuitry to be configured by selectively making an electrical connection between a substrate and the integrated circuit die, the block of circuitry to be configured having at least one solder pad that is used to selectively connect to at least one solder pad of said substrate in order to configure the block of circuitry;

applying a pattern of solder bumps to one of the die and the substrate, the pattern of solder bumps selectively excluding at least one solder bump used for connection to the at least one solder pad of the block of circuitry;

placing the integrated circuit die on the substrate with solder pads on the die aligned with solder pads on the substrate and the pattern of solder bumps disposed therebetween; and heating the solder bumps to cause the solder to flow and form electrical connections between the substrate and the die.

20. The method according to claim 19, wherein the excluded solder bump, if present, would convey power supply voltage to the block of circuitry.

21. The method according to claim 19, wherein the excluded solder bump, if present, would convey a signal as an input to a logic circuit in the block of circuitry.

22. The method in accordance with claim 19, wherein the applying is carried out by applying solder through a mask selected in accordance with the block of circuitry to be disabled.

* * * * *